(12) United States Patent
Babayan et al.

(10) Patent No.: US 8,328,982 B1
(45) Date of Patent: Dec. 11, 2012

(54) LOW-TEMPERATURE, CONVERGING, REACTIVE GAS SOURCE AND METHOD OF USE

(75) Inventors: Steve Babayan, Los Angeles, CA (US); Robert Hicks, Los Angeles, CA (US)

(73) Assignee: Surfx Technologies LLC, Culver City, CA (US)

( * ) Notice: Subject to any disclaimer, the term of this patent is extended or adjusted under 35 U.S.C. 154(b) by 1088 days.

(21) Appl. No.: 11/532,749

(22) Filed: Sep. 18, 2006

Related U.S. Application Data

(60) Provisional application No. 60/717,605, filed on Sep. 16, 2005.

(51) Int. Cl.
*C23C 16/50* (2006.01)
*C23C 16/00* (2006.01)
*C23F 1/00* (2006.01)
*H01L 21/306* (2006.01)

(52) U.S. Cl. ............ 156/345.43; 118/715; 118/723 DC; 156/345.33

(58) Field of Classification Search .................. 118/50.1, 118/715, 723 E, 723 R, 723 ER; 156/345.33, 156/345.34, 345.39, 345.49, 345.43
See application file for complete search history.

(56) References Cited

U.S. PATENT DOCUMENTS

| | | | |
|---|---|---|---|
| 3,437,864 A | 4/1969 | Kofoid et al. | |
| 4,088,926 A | 5/1978 | Fletcher et al. | |
| 4,434,742 A * | 3/1984 | Henaff et al. | 188/723 I |
| 5,147,493 A | 9/1992 | Nishimura et al. | |
| 5,198,724 A | 3/1993 | Koinuma et al. | |
| 5,285,046 A | 2/1994 | Hansz | |
| 5,309,063 A | 5/1994 | Singh | |
| 5,414,324 A | 5/1995 | Roth et al. | |
| 5,789,867 A | 8/1998 | Westendorp et al. | |
| 5,961,772 A | 10/1999 | Selwyn | |
| 5,977,715 A | 11/1999 | Li et al. | |
| 5,997,956 A * | 12/1999 | Hunt et al. | 427/446 |
| 6,204,605 B1 | 3/2001 | Laroussi et al. | |
| 6,262,523 B1 | 7/2001 | Selwyn et al. | |
| 6,465,964 B1 | 10/2002 | Taguchi et al. | |
| 6,659,110 B2 * | 12/2003 | Fornsel et al. | 134/1.1 |
| 6,730,238 B2 | 5/2004 | Li et al. | |
| 2001/0006093 A1 * | 7/2001 | Tabuchi et al. | 156/345 |
| 2002/0008480 A1 * | 1/2002 | Yamazaki et al. | 315/111.21 |
| 2002/0129902 A1 * | 9/2002 | Babayan et al. | 156/345.45 |
| 2006/0156983 A1 | 7/2006 | Penelon et al. | |

OTHER PUBLICATIONS

Inomata et al., Open air deposition of SiO2 film from a cold plasma torch of tetramethoxysilane-H2-Ar system, Appl. Phys. Lett., Jan. 3, 1994, pp. 46-47, 64(1). Koinuma et al., Development and application of a microbeam plasma. generator, Appl. Phys. Lett., Feb. 17, 1992, pp. 816-817, 60(7).

* cited by examiner

*Primary Examiner* — Parviz Hassanzadeh
*Assistant Examiner* — Tiffany Nuckols
(74) *Attorney, Agent, or Firm* — Canady & Lortz LLP; Bradley K. Lortz

(57) ABSTRACT

Devices and methods for generating a low-temperature, atmospheric pressure plasma are disclosed. A plasma device may include a first electrode having an inlet for a gas, a second electrode having an outlet for the gas and disposed proximate to the first electrode to form a substantially uniform gap therebetween. The gas flows along the substantially uniform gap and from a plurality of different directions to converge and flow through the outlet. High frequency electrical power is applied between the first electrode and the second electrode to generate a plasma within the gas flow emerging at the outlet. Precursor chemicals are added to the plasma flow at the outlet. Various electrode designs may be implemented and various applications involving surface treatment of materials with the low-temperature atmospheric plasma, including surface activation, cleaning, sterilization, etching and deposition of thin films are disclosed.

9 Claims, 9 Drawing Sheets

LOW-TEMPERATURE, CONVERGING, REACTIVE GAS SOURCE AND METHOD OF USE

CROSS-REFERENCE TO RELATED APPLICATION

This application claims the benefit under 35 U.S.C. § 119 (e) of the following U.S. provisional patent applications, which are both incorporated by reference herein:

U.S. Provisional Patent Application No. 60/717,605, filed Sep. 16, 2005, and entitled "LOW-TEMPERATURE, REACTIVE GAS SOURCE AND METHODS OF USE", by Babayan et al.

BACKGROUND OF THE INVENTION

1. Field of the Invention

The invention is related to a method and apparatus for generating a low-temperature, atmospheric pressure plasma, and its use for surface treatment and for coating substrates. In particular, the invention is related to a method and apparatus of generating a low-temperature, atmospheric pressure plasma, wherein the plasma produces a linear beam of reactive gas species that is well suited for processing substrate surfaces at high speeds. The invention is further related to specialized products that are made using the method and apparatus for generating the low temperature, atmospheric pressure plasma.

2. Description of the Related Art

Plasmas are employed in materials manufacturing for a diverse range of processes, including surface activation, etching, cleaning, sterilization, decontamination, and thin film deposition. Plasmas operate either at low pressure, <5 Torr, or at atmospheric pressure, ~760 Torr (see for example, Lieberman and Lichtenberg, "*Principles of Plasma Discharges and Materials Processing*," John Wiley & Sons, Inc., New York, 1994; Chen, "*Introduction to Plasma Physics and Controlled Fusion*," Plenum Press, New York, 1984; and Roth, "*Industrial Plasma Engineering: Vol. I, Principles*" Institute of Physics Publishing, Philadelphia, Pa., 1995). The low-pressure devices are operated in a batch mode, and find wide application in semiconductor fabrication. By contrast, atmospheric pressure plasmas may be operated in a continuous mode on an assembly line, and are more common in automotive, aerospace, and specialty materials industries.

Low-temperature, atmospheric pressure plasmas are weakly ionized discharges, such that only a small fraction of the gas molecules become ionized (see Schütze, et al., "*The Atmospheric-Pressure Plasma Jet: A Review and Comparison to other Plasma Sources*," IEEE Transactions in Plasma Science, vol. 26, page 1685 (1998)). These systems are not at equilibrium, because the temperature of the free electrons is several orders of magnitude higher that the temperature of the neutral species. Several types of non-equilibrium, atmospheric pressure plasmas have been developed over the years. These include coronas, dielectric barrier discharges, micro hollow cathode discharges, and radio frequency powered, capacitive discharges.

A corona is an electrical discharge where ionization takes place in a region of high electric field. The most common type of corona is the point-to-plane design, where one of the electrodes is a narrow wire or a metal tip and the other electrode is planar (see Goldman and Goldman, "*Corona Discharges*" Gaseous Electronics, vol. 1, (Eds: Hirsh and Oakam), Academic Press, New York, 1978). Power, at frequencies ranging from 50 Hz to 20 kHz, is supplied to the pointed electrode, creating a high electric field that promotes breakdown of the gas in the vicinity of the electrode. A localized, luminous discharge is created around the tip of the powered electrode. Since the plasma density falls rapidly away from the sharp tip, one must pass the substrate very close to the electrode for the substrate to be processed at a suitable rate. Therefore, this device is for the most part restricted to treating plastic film or fabric that is continuously passed through the plasma in a roll-to-roll format.

Dielectric barrier discharges, also known as "silent" discharges, operate with two metal electrodes, in which at least one is coated with a dielectric material. The metal electrodes are separated by a uniform gap, and are powered by DC or AC at frequencies up to 20 kHz. In most cases, dielectric barrier discharges operate in a "filamentary" or "microdischarge" mode, where the plasma exhibits short-lived micro arcs that are randomly distributed in space and time (see Eliasson and Kogelschatz, IEEE Transactions in Plasma Science, vol. 19, page 1063, 1991). A uniform, diffuse glow mode can be obtained in a dielectric barrier discharge if an inert gas such as helium, argon, or nitrogen is used as a diluent. The electron density in these plasmas varies over a wide range depending on whether the gas is sampled inside or outside a streamer. Nevertheless, the average electron density is low, $~10^9$ cm$^{-3}$, which means that like a corona, one must insert the substrate into the plasma between the electrodes to obtain a suitable surface treatment rate. Dielectric barrier discharges are primarily employed in the surface activation of plastic film.

Microhollow cathode discharges are direct-current glow discharges sustained between two parallel metal electrodes with a center opening of 0.1 mm in diameter in either the cathode, or the cathode and the anode (see Stark and Schoenbach, Applied Physics Letters, vol. 74, page 3770, 1999; and Bardos and Barankova, Surface Coating Technologies, vol. 133-134, page 522, 2000). The electrodes are separated by a gap of 0.2 to 0.4 mm, which is often filled with a dielectric material. Gas, such as argon, xenon or air is passed through the hole where it is ionized by application of DC, or in a few cases, RF power. The plasma density is highest inside the hole at $10^{14}$ cm$^{-3}$, and quickly decreases in density outside of this region. Hollow cathode discharges are mostly used as light sources and processing materials with these devices has been limited.

A nonequilibrium, atmospheric pressure discharge may be produced by flowing gas between two closely spaced metal electrodes that are driven with high-frequency power (see Koinuma et al., U.S. Pat. No. 5,198,724; Li et al., U.S. Pat. Nos. 5,977,715 and 6,730,238; and Selwyn, U.S. Pat. No. 5,961,772). These plasmas have been used to process materials placed a short distance downstream of the electrodes. The disadvantage of these designs is that the plasma beam is produced as a small spot. In addition, the concentration of reactive species generated in these plasmas is relatively low. These two facts taken together, mean that the rate of processing objects with a reasonable amount of surface area is too slow to be of practical interest. For example, Jeong et al. (Journal of Vacuum Science and Technology A, vol. 17, page 2581, 1999) showed that a 4 mm spot on a Kapton sheet is etched at a maximum speed of 8.0 microns per minute. To etch through a 25-micron sheet one-foot square would take about 16 days!

In patent application publication US 2002/0129902 A1, "Low-Temperature Compatible Wide-Pressure-Range Plasma Flow Device," dated Sep. 17, 2002, Babayan and Hicks describe an apparatus that comprises a housing with two perforated metal electrodes. Gas flows through the electrodes and is partially ionized by applying radio frequency power to one of the electrodes at 13.56 MHz. Radicals produced in the plasma flow out of the device and may be used to treat substrates placed a short distance downstream. It was observed that the etch rate of photoresist with an oxygen and helium plasma at 760 Torr was between 0.4 and 1.5 microns per minute over a circular area 30 mm in diameter. Note that the plasma device was placed close to the substrate, i.e., only 3 mm away, which is somewhat of a disadvantage for treating 3-dimensional objects.

Thus, there is a need for a low temperature, atmospheric pressure plasma that generates a linear beam of reactive gas over a wide range of distances such that the plasma can be used to rapidly treat both flat and 3-dimensional substrates of any size or shape.

SUMMARY OF THE INVENTION

To overcome the limitations in the prior art, and to overcome other limitations that will become apparent upon reading and understanding the specification, the present invention may be directed to new devices for generating plasmas at atmospheric pressure and temperatures below 600° C. A typical embodiment comprises a housing with an inlet and outlet, a curved electrode placed just before the outlet of the housing, and a high-frequency power source that is connected to the electrode and the housing. The outlet end of the housing is configured in such a way to form an annular space with a uniform gap between the electrode and the housing. In addition, the electrode is electrically isolated from the housing. Gas flows into the annular space between the electrode and the housing, and then out through the outlet of the device. Upon applying electrical power to the electrode, the gas breaks down, forming a uniform, low temperature plasma. The plasma gas flows out through the outlet of the housing and thereby produces a linear beam of reactive gas species. This beam is limited in width only by the length of the curved electrode and the housing, and can range from less than 1.0 cm to more than 300.0 cm across. Radio frequency power at 13.56 MHz is well suited for this invention, although other frequencies will work, and would be obvious to those skilled in the art.

The present invention is further embodied in a method of treating the surfaces of objects of any size and shape with the low temperature, atmospheric pressure plasma. The method comprises flowing a gas through the housing containing the curved electrode with a uniform annular space between the electrode and the housing, applying a high-frequency signal to the curved electrode so as to strike and maintain a low temperature, atmospheric pressure plasma in the annular space, and placing a substrate downstream of the outlet of the housing such that the reactive gas flowing out of the housing contacts the substrate and treats its surface. The invention is further embodied in a method of treating surfaces with the low temperature, atmospheric pressure plasma, wherein the treatment causes the surface to be activated, cleaned, sterilized, etched, or coated with a thin film.

A typical embodiment may comprise a plasma device including a first electrode having an inlet for a gas, a second electrode having an outlet for the gas and disposed proximate to the first electrode to form a gap therebetween. The gas flows into the substantially uniform gap and from a plurality of directions to converge and flow out the outlet. A high frequency electrical power is applied between the first electrode and the second electrode to generate a plasma within the gas flow. The outlet of the second electrode may be used to provide a direct impingement of a reactive gas of the plasma on a workpiece. The high frequency electrical power is commonly applied to the first electrode and the second electrode is grounded for safety because the second electrode is more likely to be exposed. In some embodiments, the first electrode and the second electrode may form a nozzle for accelerating the gas flow out of the outlet.

The device may incorporate a precursor distributor for feeding one or more precursor chemicals into the gas flow proximate to the outlet such that the plasma causes the one or more precursor chemicals to decompose and deposit a film on a workpiece placed downstream. The gap may be formed by a dielectric spacer disposed between the first electrode and the second electrode. The outlet may be circular to yield a spot plasma source or slotted to yield a linear plasma source depending upon the application.

A variety of electrode configurations may be employed. In one embodiment of the invention, the inlet comprises a plurality of pathways for directing the gas into the gap in the plurality of directions to converge at the outlet. The first electrode may employ a planar surface and the inlet may have one or more openings near an edge of the planar surface. The second electrode is shaped such that the gap is formed with the planar surface and the outlet is formed through the second electrode disposed proximate to a center of the planar surface. The planar surface may comprise a circular surface with the outlet may comprising a hole in the second electrode proximate to the center of the circular surface. Alternately, the planar surface may comprise a rectangular surface with the outlet comprising a slot in the second electrode proximate to the center of the rectangular surface.

In another embodiment, the first electrode may comprise a prismatic shape with the second electrode shaped such that the gap is formed with two lower surfaces of the prismatic shape. The outlet is disposed proximate to a converging edge of two surfaces of the prismatic shape. Similarly, the first electrode may comprise an conical shape with the second electrode shaped such that the gap is formed with a conical surface of the conical shape. The outlet is disposed proximate to a point of the inverted conical shape in this case.

In yet another embodiment, the first electrode may comprise a curved shape with the second electrode shaped such that the gap is formed with a curved surface of the curved shape of the first electrode. The outlet disposed proximate to a center of the second electrode, e.g. near an extreme of the curved surface of the first electrode. The curved shape may comprise portions of a spherical shape or of a cylindrical shape.

Similarly, a typical method of surface treatment includes the steps of flowing a gas through an inlet of a first electrode, flowing the gas along a gap between the first electrode and a second electrode disposed proximate to the first electrode such that the gas flows from a plurality of directions to converge and flow through an outlet in the second electrode, and applying high frequency electrical power between the first electrode and the second electrode to generate a plasma within the gas flow such that a reactive gas of the plasma emerges at the outlet and impinges on a workpiece placed downstream. Typically, the surface treatment is carried out at substantially atmospheric pressures and/or at temperatures below 500° C. The method may include the steps of feeding one or more precursor chemicals into the gas flow proximate to the outlet such that the reactive gas from the plasma causes the one or more precursor chemicals to decompose and depositing a thin film comprising at least one element from the one or more decomposed precursor chemicals on a workpiece placed downstream. In applying the surface treatment, the outlet may be manipulated with a robotic stage to impinge the reactive gas of the plasma on the workpiece placed downstream. The applied surface treatment under the method may be selected from the group consisting of surface activation, cleaning, etching, sterilization, decontamination and deposition of thin films. The method embodiment of the invention may be further modified consistent with the apparatus embodiments described herein.

DETAILED DESCRIPTION OF THE PREFERRED EMBODIMENT

Figure 1:
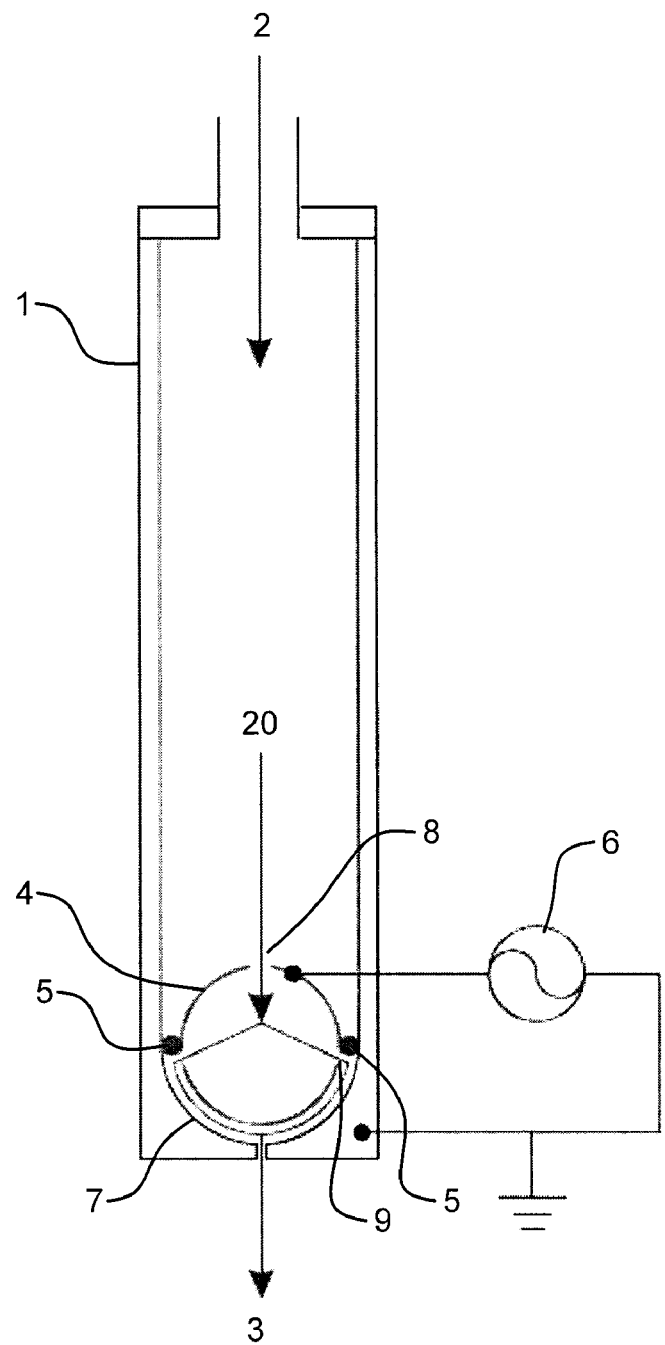
FIG. 1 is a schematic of the atmospheric pressure plasma device according to the present invention.

In the following description of the preferred embodiments, reference is made to the accompanying drawings, which form a part hereof, and in which is shown by way of illustration the specific embodiment in which the invention may be practiced. It is to be understood that other embodiments may be utilized, and structural and functional changes may be made, without departing from the scope of the present invention.

1. Overview

Various embodiments of the invention are directed to a novel device and method for delivering atmospheric plasma to be employed in a variety of surface treatment applications. In order to enhance the amount of useful plasma delivered, embodiments of the invention merge the plasma generating gap into the nozzle design where the reactive gas generated by the plasma exits the device. The benefit of this approach is to bring the workpiece surface much closer to the plasma generating zone and accordingly, much closer to the point of generation of the useful reactive gas species. In addition, embodiments of the invention flow gas along the plasma generating gap (rather than across a gap) in order to extend the time the gas spends in the gap to yield a larger volume of plasma.

In contrast, those prior art plasma devices that allow a workpiece surface to be place directly at the outlet of the device employ perforated electrodes with gas flow passing across the gap. Accordingly, the flowing gas spends only a short time in the plasma generating gap and less reactive species are produced. On the other hand, those prior art plasma devices that flow gas along a plasma generating gap rather than across it, incorporate a separate nozzle or other pathways for conducting the reactive gas from the plasma onto the workpiece surface. The amount of useful reactive species dissipates as the gas travels this extra distance from the plasma generating gap to the working surface.

Embodiments of the present invention obtain the combined benefit of prolonging the time the gas spends in the plasma generating gap as well as minimizing the distance the gas must travel to a workpiece surface. This is accomplished by employing an electrode design that results in a converging gas flow along an electrode gap to emerge directly from the electrode gap at an outlet that can be disposed directly in front of the workpiece surface. The converging gas flow is produced by gas flowing to the outlet from a plurality of different directions, e.g. from opposite ends of the first electrode or from the edges of the first electrode to an outlet disposed proximate to the center of the second electrode. Various electrode designs will be described herein to achieve converging gas flow and direct gas outlet from the plasma generating gap.

A typical embodiment of the present invention comprises a rectangular housing with a gas inlet and a gas outlet, a first electrode that is electrically insulated from the housing, a second electrode that is disposed at the gas outlet and grounded to the housing, and a high-frequency power supply that can apply electrical power to the first electrode. The first electrode and the second electrode are configured such that an annular space with a uniform gap is formed between them. Gas flows through the annular space between the first electrode and the second electrode, and is converted into a low-temperature, atmospheric pressure plasma by applying high-frequency electrical power to the first electrode. Gas containing reactive species produced in the plasma flows out through the outlet in the second electrode, and thereby produces a beam of gas containing at least one reactive species that is well suited for treating the surface of materials. The plasma source is described in more detail below.

2. Low Temperature, Atmospheric Pressure Plasma

A schematic of an exemplary plasma device is shown in FIG. 1. In this figure, the rectangular housing (1) includes a gas inlet (2) and a gas outlet (3). A curved electrode (4) is mounted in the outlet end of the housing (1), and is electrically isolated from the housing (1) by a ceramic spacer (5). A high-frequency power supply (6) is connected to the curved electrode (4) and is grounded to the housing (1). The housing (1), acting as the second electrode, is machined in such a way that an annular space (7) with a uniform gap is formed between the housing (1) and the first electrode (4). (Note that housing (1) may be efficiently formed to include the structure of the second electrode in all embodiments described herein; the housing typically comprises the second electrode). In addition, the housing is used as the grounded electrode to limit the possibility of electrical shock.) Gas flows into the housing (1) through the inlet (2), then passes into the annular space (7) where it is converted to a low-temperature, atmospheric pressure plasma by application of electrical power from the high-frequency power supply (6). The first electrode (4) has an inlet (20) that includes a plurality of pathways (left and right as shown) for directing the gas into the substantially uniform gap between the housing (1) and the first electrode (4) such that the gas flow converges at the outlet from a plurality of directions. The gas containing radicals and other reactive species produced in the plasma flows out the outlet (3) of the housing (1), forming a direct beam of reactive gas that is suitable for the surface treatment of materials.

In one example, the curved electrode (4) shown in FIG. 1 may employ a cylindrical shape viewed from one end (comprising a semi-cylindrical surface in the area of the electrode gap). The diameter of the cylinder can vary over a wide range, so long as a uniform gap of between 0.1 to 5.0 mm is maintained between the electrode (4) and the housing (1). The typical diameter of the cylindrical electrode lies between 0.5 and 20.0 cm, and in particular, between 1.0 and 10.0 cm. The length of the electrode (4) may be any distance from less than 1.0 cm to more than 300.0 cm. The length of the housing (1) should be at least slightly larger than the electrode (4) so that the electrode (4) can be mounted inside the housing (1). The gas may pass through the curved electrode (4) into the annular space (7) by means of slits (8) and (9) as shown. The slits (8) and (9) may extend substantially along the length of the electrode (4), and preferably extend at least the same distance as the distance the gas outlet (3) extends along the length of the housing (1).

In other variations, the pathways of the gas flowing into and between the electrodes may be altered. For example, the electrodes may be configured such that the gas passes around the curved electrode (4), entering the annular space (7) from outside the electrode (4). In this case, the ceramic spacer (5) may be replaced with a ceramic collar (which may also be described as a dielectric spacer) that is placed at the end of the electrode (4) to keep it electrically isolated from the housing (1).

To operate the plasma device depicted in FIG. 1, gas is passed through the housing (1) and high-frequency power is supplied to the electrode (4) sufficient to strike and maintain the low-temperature, atmospheric pressure plasma in the annular space (7). Gas feeds that are particularly well suited for use with this device are a mixture of an inert gas, such as helium or argon, and a molecular gas, including but not limited to oxygen, nitrogen, hydrogen, carbon tetrafluoride, sulfur hexafluoride, ammonia, carbon dioxide, water vapor, and mixtures thereof. The particular gas composition used depends on the application of the plasma device for surface treatment. For example, oxygen and argon plasmas are effective for cleaning and sterilizing surfaces and for etching polymers, whereas carbon tetrafluoride and argon plasmas are effective for etching glass and some metals. A wide range of gas compositions may be used to form the low-temperature, atmospheric pressure plasma. Gas compositions that are particularly well suited for plasma operation comprises an inert gas and from 0.5 to 10.0 volume percent of a molecular gas. Under certain circumstances, air can be used as a feed gas for the plasma device as well.

A wide range of frequencies may be used to operate the plasma device, and would be obvious to those skilled in the art. Radio frequency (RF) power at a multiple of n times 13.56 megahertz (MHz), where n is an integer from 1 to 20, is well suited for striking and maintaining the plasma discharge. Particularly useful radio frequencies for device operation are n times 13.56 MHz, where n equals 1, 2, 3 or 4. Another useful radio frequency is 40.0 MHz, for example. When radio frequency power is used, a matching network is required to tune the power input to the impedance of the plasma so that nearly all the power is consumed by the plasma and not reflected back to the supply. The impedance matching network is inserted between the power supply (6) and the circular electrode (4). Matching networks are a common feature of RF plasma discharges, and their use in the present invention would be obvious to those skilled in the art.

The curved electrode can be shaped in other ways than the cylinder illustrated in FIG. 1. The invention is further embodied in electrode shapes that include, but are not limited to, ellipses, parabolas, U-shapes, and V-shapes where the pointed end of the V is rounded off. In each of these designs, it is understood by those skilled in the art that a uniform gap spacing of between 0.1 to 5.0 mm is to be maintained between the curved electrode and the housing. This is accomplished by machining the inner surface of the housing at the outlet end into the same shape as the outer surface of the curved electrode. It is further understood by those skilled in the art that one may use other materials and dimensions for the housing and curved electrode without departing from the scope of the present invention.

3. Low Temperature, Atmospheric Pressure Plasma for Depositing Coatings

Figure 2:
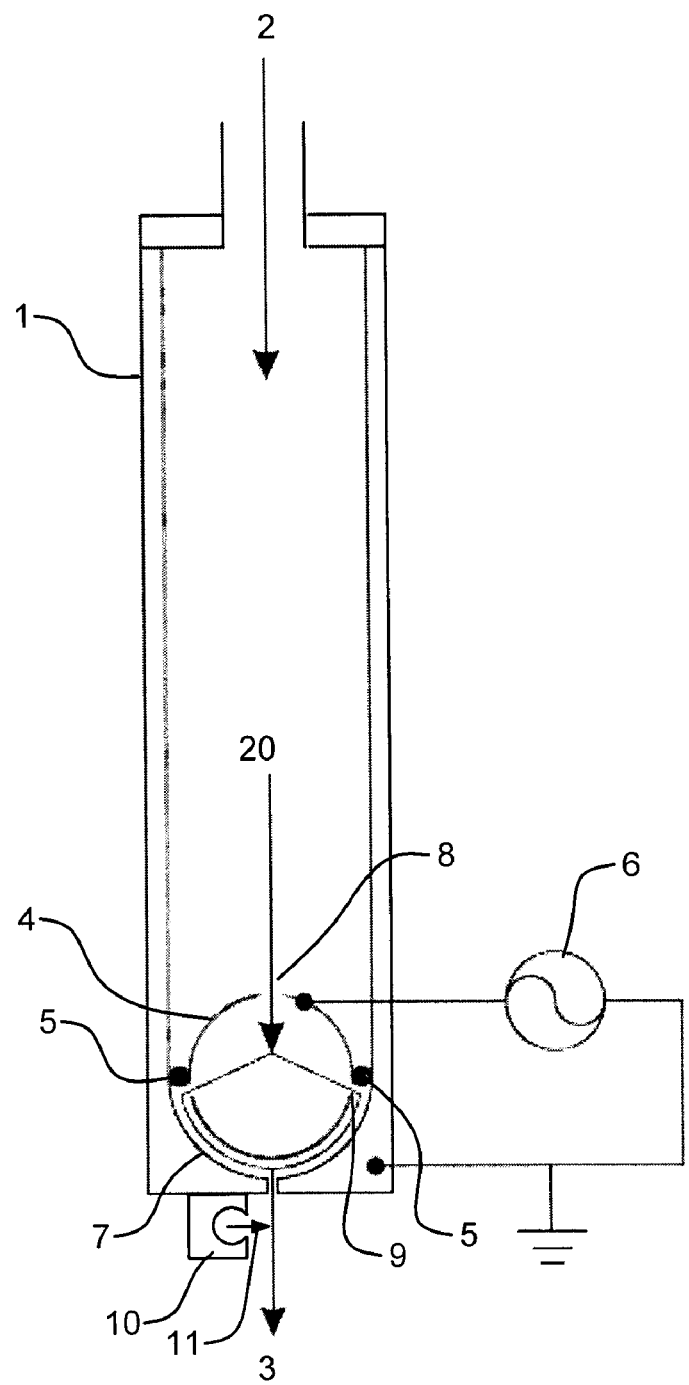
FIG. 2 is a schematic of the atmospheric pressure plasma device configured for the deposition of thin films according to the present invention.

A schematic is presented in FIG. 2 of the low temperature, atmospheric pressure plasma configured for the deposition of thin film coatings. Like the device of FIG. 1, the first electrode (4) has an inlet (20) that includes a plurality of pathways (left and right as shown) for directing the gas into the substantially uniform gap between the housing (1) and the first electrode (4) such that the gas flow converges at the outlet from a plurality of directions. A precursor distributor (10) has been mounted at the gas outlet (3) to the housing (1). Volatile chemical precursors are fed into the distributor and out through a slit (11) in the side of the distributor (10), where they mix with the reactive gas beam emanating from the plasma device outlet (3). The active species in the gas attack the chemical precursor, causing it to decompose and deposit a thin film on a substrate located a short distance downstream. For instance, the chemical precursor may be hexamethyldisiloxane (HMDS). By mixing this molecule with the effluent from an oxygen and argon plasma, a silicon dioxide film (i.e., glass) may be deposited onto the substrate.

4. Low Temperature, Atmospheric Pressure Plasma Device with Planar Electrodes

Figure 3:
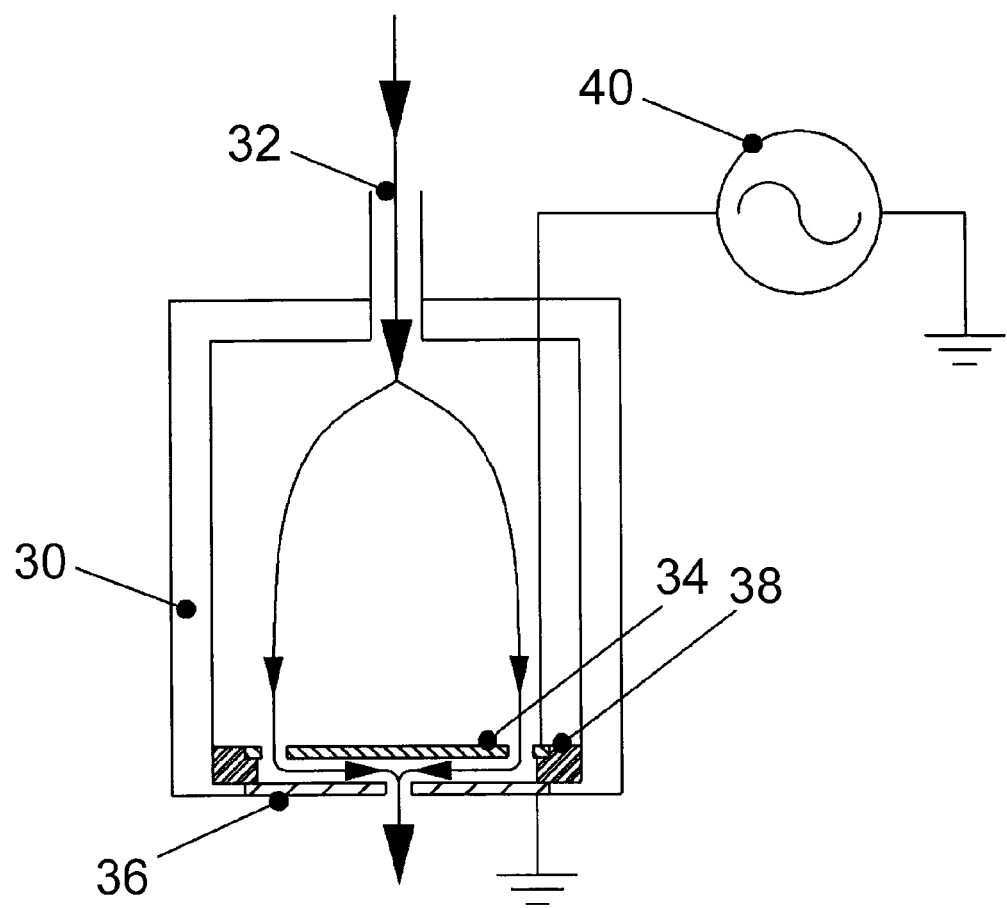
FIG. 3 is a schematic of an embodiment of a plasma device using planar electrodes.

FIG. 3 is a schematic of an embodiment of a plasma device using planar electrodes. The process gas enters the body (30) through a gas connection (32). The gas then flows through the upper electrode (34) (first electrode) into the gap formed between the upper electrode (34) and lower electrode (36) (second electrode). The dielectric spacer (38) defines the gap between the upper and lower electrodes (34) and (36). The process gas flows out of the center perforation in the lower electrode (36). A radio frequency power system (40) delivers high frequency power to the upper electrode (34) while the lower electrode (36) is grounded. Just as with the embodiment described in FIGS. 1 and 2, here also, gas flowing from a plurality of directions converges as it flows along an electrode gap to an outlet from the lower electrode. In this case, the inlet in the upper electrode (34) comprises a plurality of openings at an edge of the electrode (34), e.g. opposite sides. The planar electrodes (34) and (36) may be configured in a variety of shapes as describer hereafter.

Figure 4:
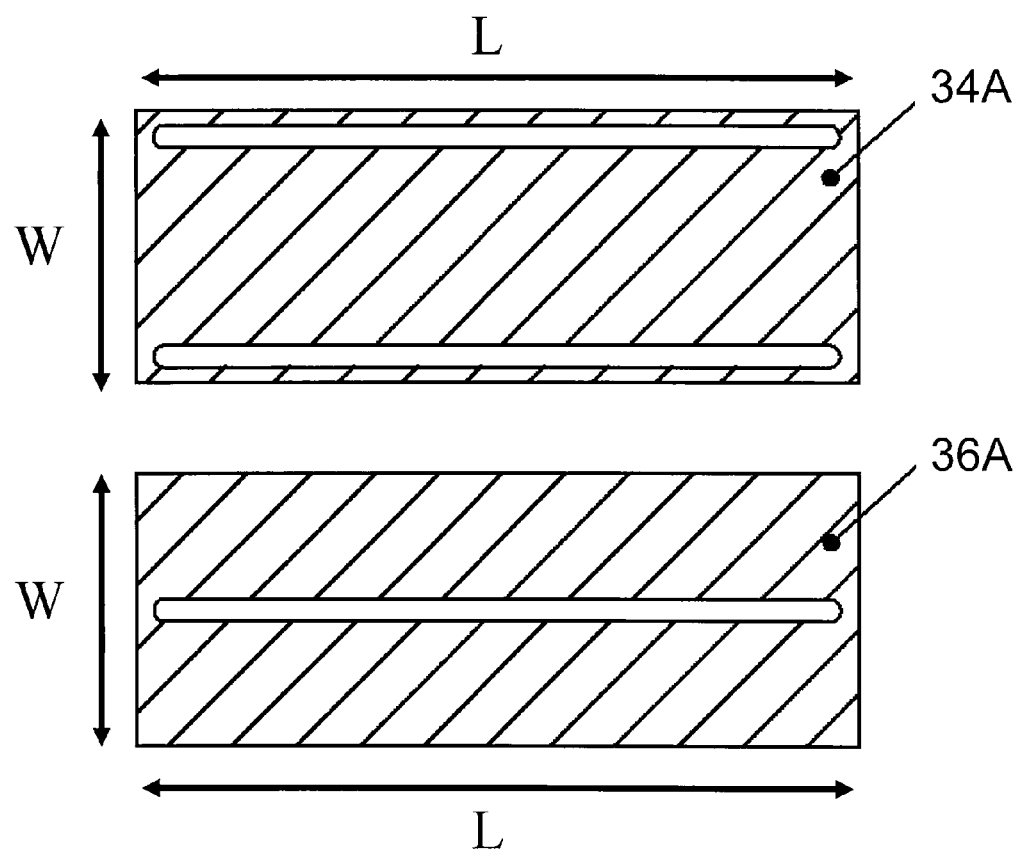
FIG. 4 illustrates exemplary pathways for the flowing gas with rectangular electrodes for the plasma device of FIG. 3.

FIG. 4 illustrates exemplary pathways for the gas to flow through rectangular electrodes for the plasma device of FIG. 3. In this case, the body (30) in FIG. 3 would have a rectangular shape to mount electrodes (34A) and (36A) into the dielectric spacer (38) (in place of electrodes (34) and (36), respectively in FIG. 3), thereby defining a gap between the electrodes, and causing the gas to flow through the slots in electrode (34A) at opposing edges, then between the gap, and out through the center slot in electrode (36A). The electrodes (34A) and (36A) in FIG. 4 are defined by a width, W, and a length, L. In one example, the width may be between 0.5 and 5.0 cm, preferably about 3.0 cm. The length can vary over a wide range from between 0.5 cm and more than 300 cm.

Figure 5:
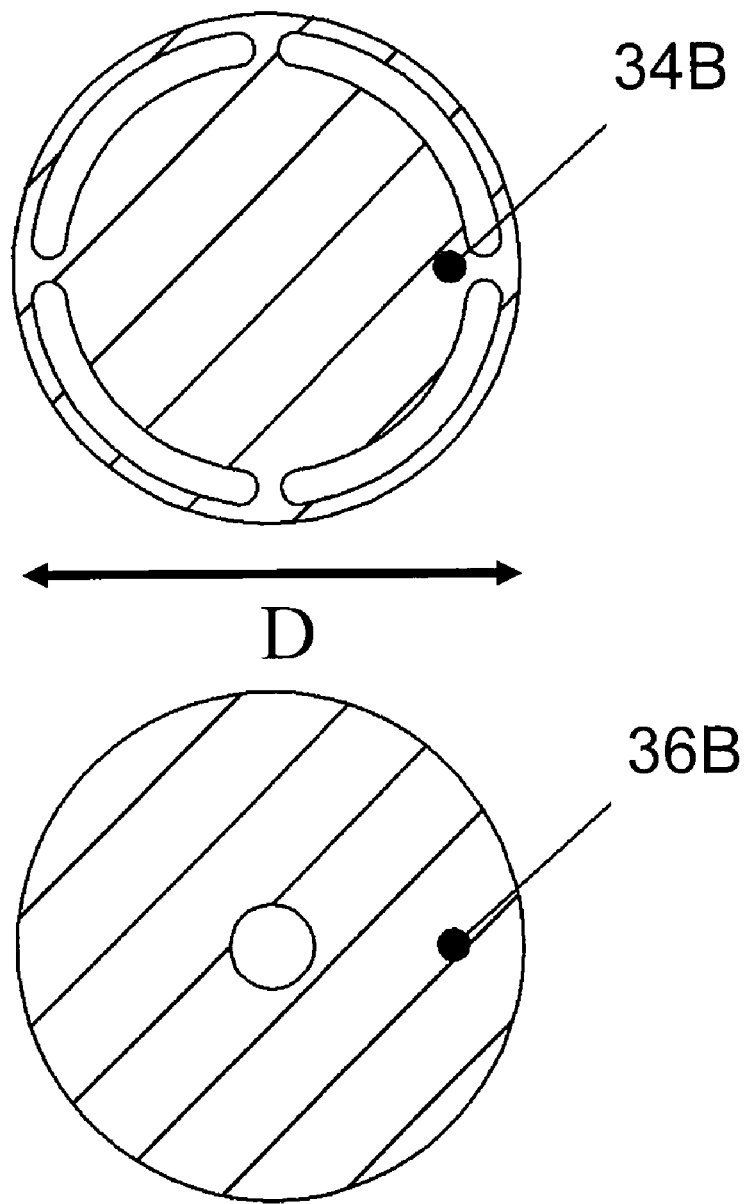
FIG. 5 illustrates exemplary pathways for the flowing gas with circular electrodes for the plasma device of FIG. 3.

FIG. 5 illustrates exemplary pathways for the gas to flow through circular electrodes for the plasma device of FIG. 3. In this case, the body (30) in FIG. 3 would have a cylindrical shape to mount electrodes (34B) and (36B) into the dielectric spacer (38) (in place of electrodes (34) and (36), respectively in FIG. 3), thereby defining a gap between the electrodes, and causing the gas to flow through the four peripheral slots in electrode (34B), then between the gap, and out through the center hole in electrode (36B). The electrodes (34B) and (36B) in FIG. 3 are defined by a diameter, D, which may be between 0.5 and 5.0 cm, preferably about 3.0 cm, in one example.

Although the planar electrodes (34) and (36) of FIG. 3 have been illustrated in the examples of rectangular electrodes in FIG. 4 and circular electrodes in FIG. 5, embodiments of the invention are not limited to these electrode shapes. Those skilled in the art will understand that any planar electrode shape so long as gas flowing from a plurality of directions converges as it flows along an electrode gap to an outlet from the lower electrode (36).

Figure 6:
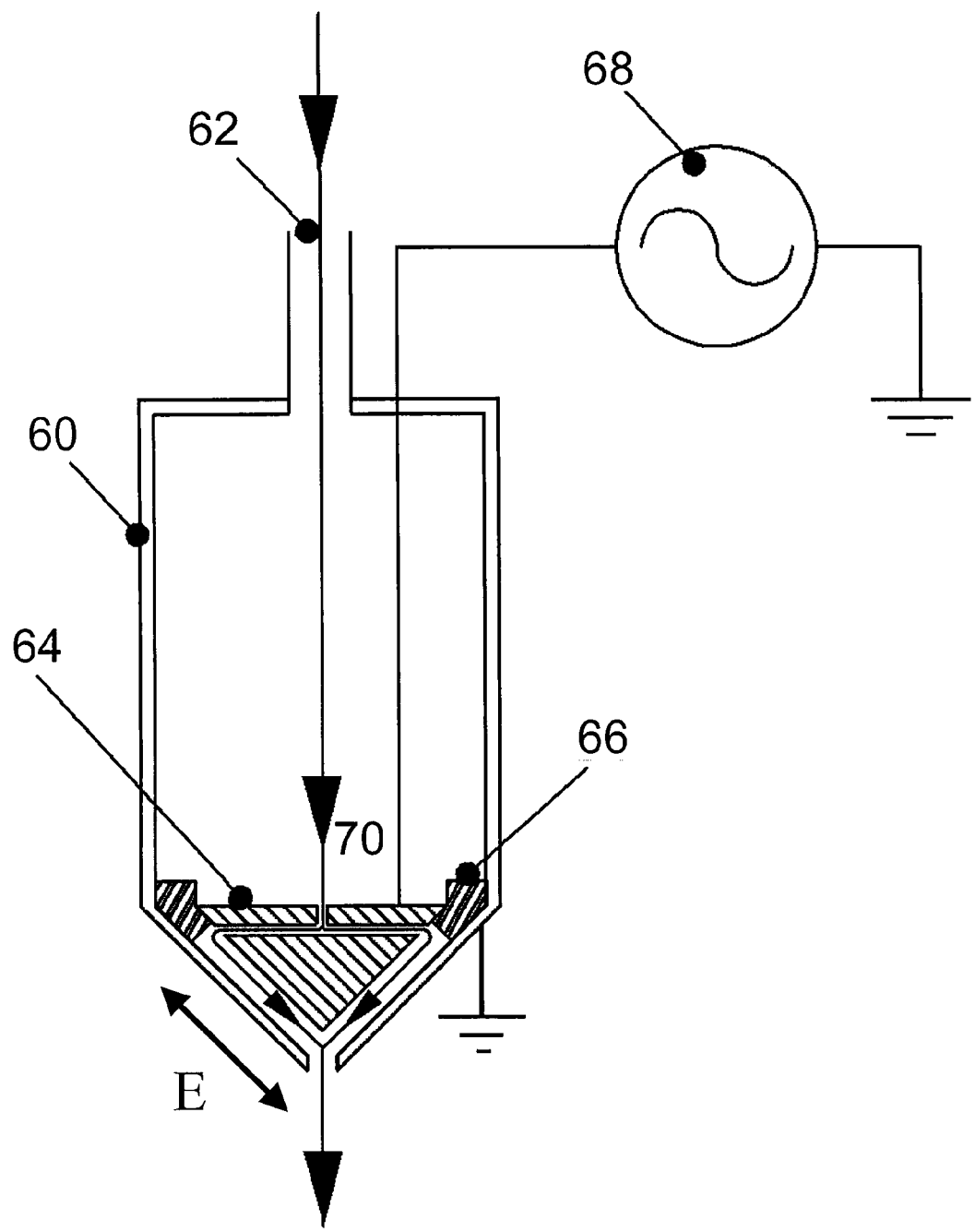
FIG. 6 is a schematic of an embodiment of a plasma device using a tapered electrode.

5. Low Temperature, Atmospheric Pressure Plasma Device with Tapered Electrode FIG. 6 is a schematic of an embodiment of a plasma device using a tapered electrode. The process gas enters the body (60) through a gas connection (62). The gas then flows through tapered electrode (64) (first electrode) into a gap formed between the electrode (64) and the body (60) at opposite sides of the electrode (64) and along the taper to converge at the outlet in the body (60). As before, the body (60) is grounded to function as the second electrode. As shown, the tapered electrode (64) has a central inlet (70) and pathways which direct gas flow to the edges to enter the gap. However, the inlet of the electrode (64) may alternately comprise one or more passages to direct the gas flow directly into the gap at the edges. The dielectric spacer (66) defines the gap between the electrode (64) and body (60). The process gas then flows out of the open slot in the end of body (60). A radio frequency power system (68) delivers high frequency power between electrode (64) and body (60).

In one embodiment, electrode (64) of FIG. 6 may be employed in the shape of an inverted prism, where the base of the prism defines a rectangle of width, W, and length, L. The edge of the prism, E, defines the third dimension of the electrode (64). In one example, the edge, E, may be between 0.5 and 5.0 cm. The width, W, can vary between 0.5 and 10.0 cm, and the length, L, can vary over a wide range from between 0.5 cm and more than 300 cm.

Alternately, the electrode (64) depicted in FIG. 6 may be fashioned into the shape of an inverted cone. In this case, the body (60) would be configured as a cylinder in the region above the dielectric spacer (66) and as a cone in the region below the dielectric spacer (66). The dielectric space would be fashioned into a ring and would define a uniform gap between the conical electrode (64) and body (60). Gas flowing through the device would converge to exit through a circular hole at the end of the truncated cone defined by the body (60), the second electrode. In this case, the edge of the cone, E, defines the size of the electrode (64). In one example, the edge, E, may be between 0.5 and 5.0 cm.

Figure 7:
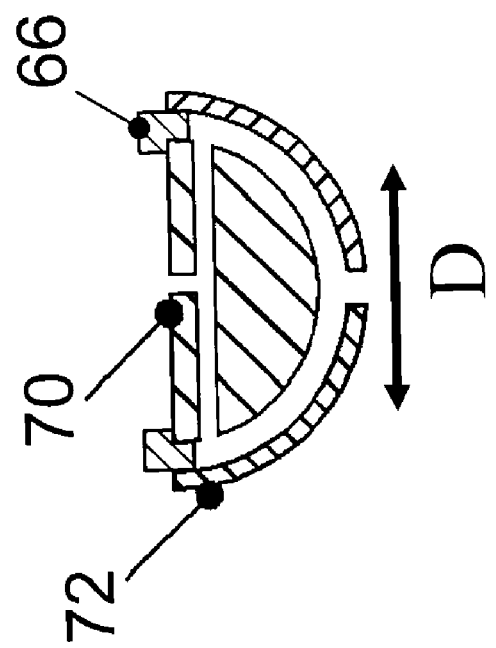
FIG. 7 illustrates exemplary spherical or cylindrical electrode surfaces for converging gas flow in a gap.

FIG. 7 illustrates exemplary cylindrical or spherical electrode surfaces for converging gas flow in a gap. Here the upper electrode (70) and lower electrode (72) are both curved. These electrodes can fit into a housing (30) similar to that depicted in FIG. 3. A gap between electrodes (70) and (72) would be defined by a dielectric spacer (38). The process gas would pass through the gap between electrodes (70) and (72), and a plasma would be generated by applying radio frequency power to electrode (70) while electrically grounding electrode (72). In one embodiment, electrodes (70) and (72) may employ hemispherical surfaces such that the outlet in electrode (72) for the converging gas flow is a circular hole from a plurality of directions around the hemisphere as it passes along the gap between electrodes (70) and (72). The size of the hemispherical electrode (70) is defined by a diameter, D, which may be between 0.5 and 5.0 cm, for example.

In another embodiment of the invention, electrodes (70) and (72) may be fashioned into the shape of half cylinders such that the electrodes gap is formed by semi-cylindrical surfaces of the electrodes (70) and (72), where the diameter of the electrode (70) half cylinder is defined by D, and the axis of the cylinder is perpendicular to the diameter, D. The diameter of the electrode (72) half cylinder is larger than that of electrode (70), such that a uniform gap is established between the electrodes. In this case, the lower electrode (72) has a slot as the outlet for the converging gas flow from opposite sides of the half cylinder. The diameter, D, of the electrode (70) half cylinder may be between 0.5 and 5.0 cm, for example. The axis of the cylinder can vary over a wide range from 0.5 to more than 300 cm.

Figure 8:
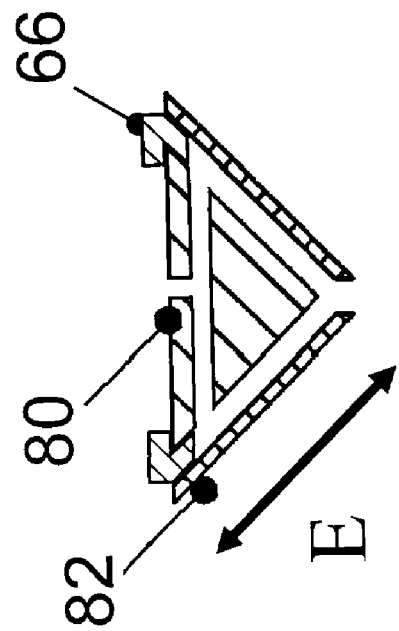
FIG. 8 illustrates exemplary prismatic or conical electrode surfaces for converging gas flow in a gap.

FIG. 8 illustrates exemplary prismatic or conical electrode surfaces for converging gas flow in a gap. Here the upper electrode (80) and lower electrode (82) both have a V-shaped cross section. These electrodes can be configured to fit into a housing (60) similar to that depicted in FIG. 6. A gap between electrodes (80) and (82) may be defined by a dielectric spacer (66). The process gas would pass through the gap between electrodes (80) and (82), and a plasma can be generated by applying radio frequency power to electrode (80) while electrically grounding electrode (82). In one embodiment, electrode (80) may have an inverted conical shape (similar to the variant described for FIGS. 1 and 2). In this case, the lower electrode (82), has a matching (mirrored) shape properly form the gap between the electrodes (80) and (82) to produce the converging gas flow from the periphery of the cone base (at the top) to the circular outlet in the lower electrode (82).

In another embodiment, electrode (80) may instead be an inverted prism (similar to the embodiment described for FIGS. 1 and 2), such that the opening in the lower electrode (82) is a slot. In this case, the gas flow converges from opposing edges of the prismatic shaped electrode (80) along the gap formed by the matching shaped electrode (82) to the slotted outlet in the electrode (82). The edge, E, of the V-shaped upper electrode (80), whether in the form of an inverted cone or prism, may be between 0.5 and 5.0 cm. In the case of a prism, the length, L, of the prism that defines the slot for gas to exit the device can vary over a wide range from 0.5 to 300 cm.

6. Method of Processing Objects

Figure 9:
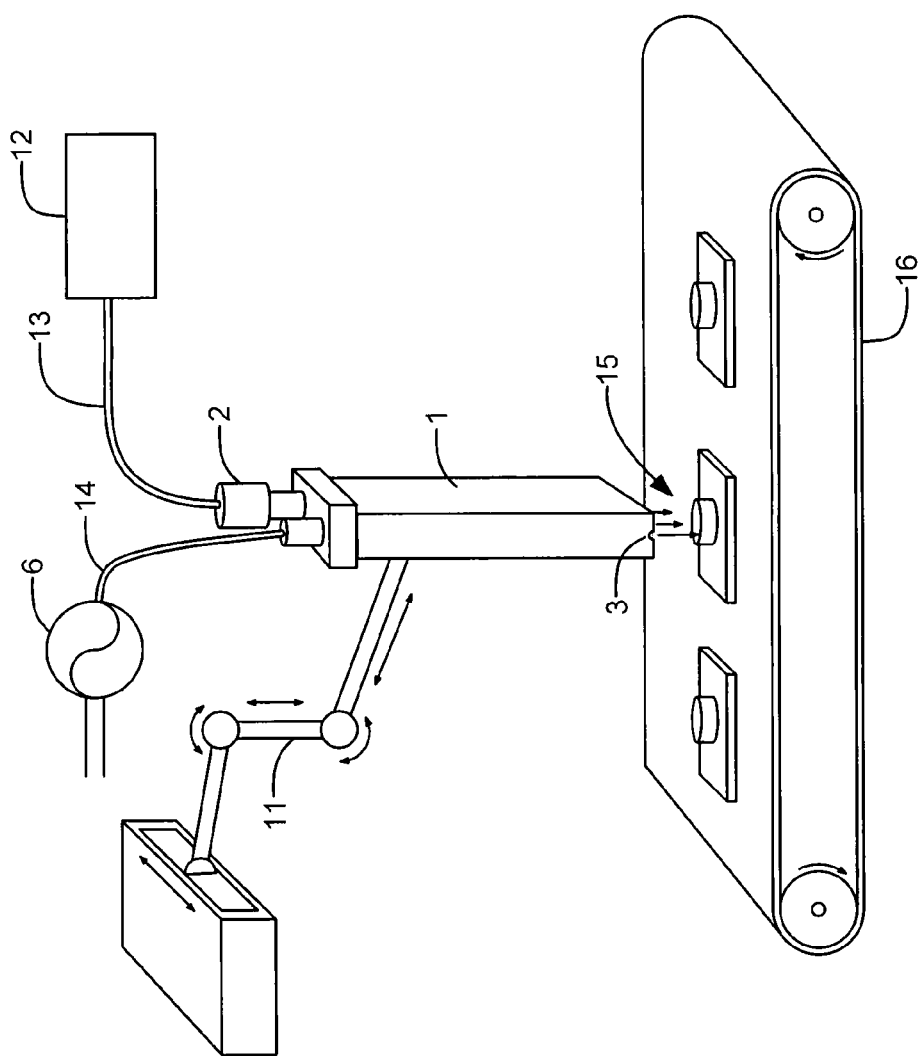
FIG. 9 is a schematic of the present invention configured for the continuous, in-line treatment of three-dimensional objects.

A typical embodiment of the present invention is a method of using the low temperature, atmospheric pressure plasma for the surface treatment of objects. One way to practice this invention is illustrated in FIG. 9. The plasma device, comprising the rectangular housing (1) with gas inlet (2), gas outlet (3) and first electrode (not shown), is mounted on a robotic stage (11). The plasma device is attached to the high-frequency power supply (6) and a gas manifold (12) by means of flexible cables (13) and (14). Objects (15) to be treated by the plasma are placed on a conveyor (16). As the objects (15) move continuously down the conveyor (16), the plasma device rapidly scans over the surface of each object (15), providing them with a uniform treatment. Depending on the gases fed to the plasma, the treatment would be used to activate, clean, etch, sterilize, or deposit a thin film onto the 3-D object.

Many types of objects may be treated with the low-temperature, atmospheric pressure plasma using the apparatus shown in FIG. 9. For example, the object may be a plastic component of an automobile, such as a bumper. Here, the plasma treatment may be used to activate the surface of the plastic component so that paint would wet its surface, and thereby form a more uniform and strongly adherent coating.

The automobile would be on an assembly line, and the atmospheric pressure plasma device would be mounted on an industrial robot that would sweep the plasma device uniformly over the bumper surface. Other objects that may be treated in a similar fashion with the present invention, and include, but are not limited to: automobile windshields; plastic components used in the interior of automobiles; plastic housings used in consumer electronics, such as cellular telephones, compact disc players, personal digital assistants, cameras, video recorders, televisions, radios, and video game consoles; composites used in the interior and exterior of aircraft and watercraft; polymers used in electronics; integrated circuit packages; and metal parts used in electronic, optical and mechanical systems.

In another embodiment of the present invention, the low-temperature, atmospheric pressure plasma device may be mounted in a fixed position above a flat sheet of material that would be is passed underneath the reactive gas beam in a roll-to-roll configuration. In this case, the plasma device may be modified so that the width of the reactive gas beam would be equal to the width of the flat sheet. The distance from the plasma device to the surface of the sheet of material would be between 0.1 and 5.0 cm. As the sheet is passed under the reactive gas beam, its surface would be activated, cleaned, etched, sterilized, decontaminated or coated with a thin film. Materials that may be plasma treated according to this embodiment of the invention include, but are not limited to, plastic film, fabric, paper, wood, rubber, glass, and metal.

Figure 10:
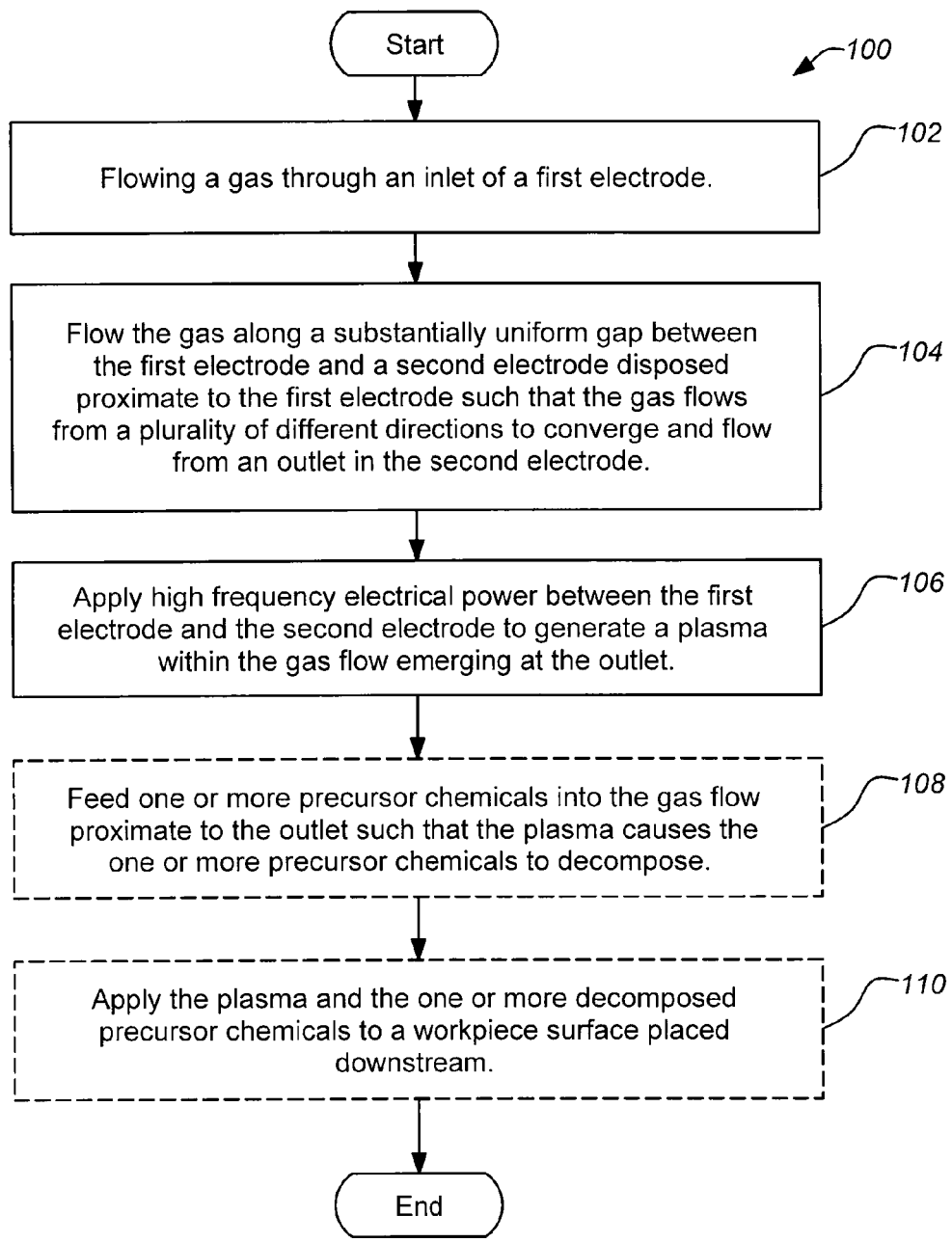
FIG. 10 is flowchart of an exemplary method of atmospheric plasma surface treatment.

FIG. 10 is flowchart of an exemplary method (100) of atmospheric plasma surface treatment. The method (100) begins with an operation (102) of flowing a gas through an inlet of a first electrode. Next, in operation (104) the gas is flowed along a substantially uniform gap between the first electrode and a second electrode disposed proximate to the first electrode such that the gas flows from a plurality of different directions to converge and flow from an outlet in the second electrode. In operation (106) high frequency electrical power is applied between the first electrode and the second electrode to generate a plasma within the gas flow emerging at the outlet.

The method (100) may further include the operation (108) of feeding one or more precursor chemicals into the gas flow proximate to the outlet such that the plasma causes the one or more precursor chemicals to decompose. In addition, in operation (110) the plasma and the one or more decomposed precursor chemicals are applied to a workpiece surface placed downstream in order to deposit a thin film coating thereupon. The plasma and the one or more decomposed precursor chemicals may be applied with a robotic stage. The method embodiment of the invention may be further modified consistent with the apparatus embodiments previously described.

The following examples describe specific methods of using the low-temperature, atmospheric pressure plasma. These are not intended to limit the field of use of the device. Many other applications are possible, and would be obvious to those skilled in the art.

EXAMPLE 1

Surface Activation

The apparatus shown in FIG. 1 was used to activate the surface of plastic materials. A mixture of helium at 30.0 L/min and oxygen at 1.5 L/min was fed into the rectangular housing. The plasma was struck in the device by applying radio frequency power at 250 W and 27.12 MHz. The plastic was placed 1.0 cm downstream of the outlet of the housing, and the housing was scanned over the sample at a constant rate. Before and after plasma treatment, the surface energy of each material was measured with ACCUDYNE Test markers. The results of these experiments are shown in TABLE 1.

TABLE 1

| Surface activation of plastic samples. | | | | |
|---|---|---|---|---|
| | Surface energy (dyne/cm) | | Scan rate | Exposure |
| Substrate | Initial | Final | (cm/s) | time (s) |
| Polypropylene | 32 | 70+ | 1.3 | 0.06 |
| Nylon | 46 | 70+ | 2.5 | 0.03 |
| Silicone rubber | 30 | 70+ | 1.3 | 0.06 |
| ABS | 42 | 70+ | 1.3 | 0.06 |
| HDPE | 38 | 70+ | 0.6 | 0.13 |

A surface energy greater than 70 dyne/cm means that the sample surface is hydrophilic, and that a water droplet will spread out flat on it. On polypropylene, silicon rubber, and acrylonitrile-butadiene-styrene (ABS), the 70+ dyne/cm surface energy was achieved at a scan speed of 1.3 cm/s. On nylon the scan rate needed for surface activation was 2.5 cm/s, whereas on high-density polyethylene (HDPE) it was 0.6 cm/s. To obtain the exposure time with the plasma beam, one divides the width of the beam, i.e., 0.8 mm, by the scan rate. These data are shown in the last column of TABLE 1. The time needed to activate the plastic surfaces is very short, ranging from 0.03 to 0.13 seconds. It is evident that the present invention is advantageous for the rapid surface activation of polymers.

EXAMPLE 2

Etching KAPTON

The present invention may be used to etch materials. For example KAPTON may be etched by exposure to the oxygen plasma, whereas silicate glass and tantalum may be etched by exposure to a fluorine and oxygen plasma. The apparatus presented in FIG. 1 was used to etch KAPTON films, 50 microns thick, at the following conditions: 30 L/min helium, 0.5 to 2.0 L/min oxygen, 270 W RF power, and 0.5 cm distance from the device outlet to the film. Shown in TABLE 2 below is the effect of the oxygen flow rate on the etch rate of the KAPTON film. The etch rate increases gradually with the oxygen flow rate from 1.4 microns per second at 0.5 L/min to 2.8 microns per second at 2.0 L/min. Note that the temperature of the gas exiting the plasma device increases with the oxygen flow rate from about 280 to 350° C., and this may be partly responsible for the increase in etch rate. Nevertheless, the rapid etch rate observed with the low-temperature, atmospheric pressure plasma demonstrates that the present invention is a significant improvement over the prior art.

Many different materials may be etched with the low temperature, atmospheric pressure plasma, including but not limited to polymer films using the oxygen plasma, and silicon, silicon nitride, tungsten, and tantalum using the carbon tetrafluoride and oxygen plasma.

TABLE 2

Effect of oxygen flow on etch rate of KAPTON film with plasma device.

| O$_2$ flow (L/min) | Etch through time (s) | Etch rate (μm/s) | Gas temperature (° C.) |
|---|---|---|---|
| 0.50 | 37 | 1.4 | 280 |
| 1.00 | 30 | 1.7 | 320 |
| 1.50 | 23 | 2.2 | 300 |
| 1.76 | 21 | 2.4 | 350 |
| 2.00 | 18 | 2.8 | 350 |

EXAMPLE 3

Deposition of Thin Films

The apparatus shown in FIG. 2 was used to deposit glass films on silicon wafers. A mixture of helium at 30 L/min and oxygen at 1.5 L/min was fed into the plasma device, while 250 W of RF power at 27.12 MHz was supplied to generate the discharge. Hexamethyldisiloxane was dispersed into helium carrier gas and introduced to the apparatus through the precursor distributor located 1.0 mm away from the outlet of the duct. A silicon wafer, 10.0 cm in diameter, was placed on a holder 5.0 mm downstream of the distributor, and spun at a rate of ~150 RPM. Listed in TABLE 3 is the dependence of the average thickness of the glass film on the substrate exposure time. The average deposition rate is shown in the third column of the Table, which is calculated by dividing the average film thickness by the time and multiplying this quantity by the area of the wafer (78.5 cm$^2$) divided by the area of the plasma beam (0.4 cm$^2$).

TABLE 3

Deposition of glass films with the present invention.

| Exposure time (s) | Average film thickness (nm) | Deposition rate (μm/s) |
|---|---|---|
| 15.0 | 275 | 0.37 |
| 30.0 | 440 | 0.30 |
| 45.0 | 675 | 0.30 |
| 60.0 | 960 | 0.32 |

The average rate of deposition obtained with the low-temperature, atmospheric pressure plasma device (e.g. of FIG. 2) is 0.32 microns per second. The deposition rates recorded for the present invention may be compared to those obtained using atmospheric pressure plasmas described in the prior art. The rates reported in the prior art are usually less than 0.01 microns per second. For example, Babayan et al. in *Plasma Sources Science and Technology*, vol. 7, page 286 (1998) reported a maximum glass deposition rate of 0.005 microns per second using an atmospheric pressure plasma jet. It is evident that embodiments of the present invention deposit thin films at much higher rates than attained previously, and is a significant improvement over the prior art.

Many different organic, inorganic and metallic thin films may be similarly deposited in the manner described above without departing from the scope of the present invention. The only requirement is that the elements required in the film can be fed to the low temperature, atmospheric pressure plasma through a volatile chemical precursor. Thin film materials that may be deposited using this method include, but are not limited to, semiconductors, polymers, metals, metal oxides, metal nitrides, metal carbides, and metal phosphides.

What is claimed is:

1. A plasma device comprising:
 a first electrode having an inlet for a gas; and
 a second electrode having a single outlet for the gas and disposed proximate to the first electrode to form a substantially uniform gap between surfaces of the first and the second electrode surfaces such that the gas flows into the gap from a plurality of different directions to converge and flow through the single outlet;
 wherein high frequency electrical power is applied between the first electrode and the second electrode to generate a plasma within the converging gas flow in the gap to emerge at the single outlet at atmospheric pressure and the first electrode comprises a hemispherical shape having a diameter substantially between 0.5 and 5.0 cm and the second electrode is shaped such that the substantially uniform gap is formed with a hemispherical surface of the hemispherical shape of the first electrode and the single outlet is disposed proximate to a center of the second electrode.

2. The plasma device of claim 1, wherein the single outlet of the second electrode provides a direct impingement of a reactive gas of the plasma on a workpiece.

3. The plasma device of claim 1, wherein the inlet comprises a plurality of pathways for directing the gas into the gap in the plurality of directions to converge at the single outlet.

4. The plasma device of claim 1, wherein the gap is formed by a dielectric spacer disposed between the first electrode and the second electrode.

5. The plasma device of claim 1, wherein the curved shape comprises a portion of a cylindrical shape and the curved surface comprises a cylindrical surface.

6. The plasma device of claim 1, wherein the single outlet is circular to yield a spot plasma source.

7. The plasma device of claim 1, wherein the single outlet is slotted to yield a linear plasma source.

8. The plasma device of claim 1, further comprising a precursor distributor for feeding one or more precursor chemicals into the gas flow proximate to the single outlet such that the plasma causes the one or more precursor chemicals to decompose and deposit a film on a workpiece placed downstream.

9. The plasma device of claim 1, wherein the first electrode and the second electrode form a nozzle for accelerating the gas flow out of the single outlet.

* * * * *